United States Patent [19]

Gehring

[11] Patent Number: 4,645,949
[45] Date of Patent: Feb. 24, 1987

[54] CIRCUIT ARRANGEMENT FOR ENHANCING THE UTILIZABLE HALL-SIGNAL OF HALL SENSOR

[75] Inventor: Gerhard Gehring, Unterhaching B. München, Fed. Rep. of Germany

[73] Assignee: Siemens Aktiengesellschaft, Berlin and Munich, Fed. Rep. of Germany

[21] Appl. No.: 596,564

[22] Filed: Apr. 4, 1984

Related U.S. Application Data

[63] Continuation of Ser. No. 281,212, Jul. 7, 1981.

[30] Foreign Application Priority Data

Jul. 10, 1980 [DE] Fed. Rep. of Germany ....... 3026226

[51] Int. Cl.[4] ...................... H03K 17/90; H03K 19/18
[52] U.S. Cl. ............................... 307/309; 324/117 H; 330/6
[58] Field of Search ............ 307/309; 324/45, 117 H, 324/251; 330/6

[56] References Cited

U.S. PATENT DOCUMENTS

| | | | |
|---|---|---|---|
| 3,558,934 | 1/1971 | Dorsch | 307/309 |
| 3,622,898 | 11/1971 | Salmon | 307/309 |
| 3,634,657 | 1/1972 | Ballard | 307/309 |
| 3,867,652 | 2/1975 | Bjorklund et al. | 307/309 |
| 4,199,696 | 4/1980 | Tanaka et al. | 307/309 |

Primary Examiner—John S. Heyman
Assistant Examiner—B. P. Davis
Attorney, Agent, or Firm—Herbert L. Lerner; Laurence A. Greenberg

[57] ABSTRACT

Circuit for enhancing the utilizable Hall signal of a Hall sensor, including N Hall generators being operated with impressed control current and having Hall signal paths, N voltage to current converters each having an output and each being coupled to the Hall signal path of a different one of the Hall generators, and a common output connected to each of the outputs of the voltage to current converters.

4 Claims, 3 Drawing Figures

CIRCUIT ARRANGEMENT FOR ENHANCING THE UTILIZABLE HALL-SIGNAL OF HALL SENSOR

This application is a continuation of application Ser. No. 281,212, filed July 7, 1981 now abandoned.

The present invention relates to a circuit arrangement for enhancing the utilizable Hall signal of a Hall sensor, with at least one Hall generator operated with impressed control current and a voltage-to-current converter coupled to the Hall signal path of the Hall generator.

Hall generators are preferably operated with constant (impressed) control current, because the Hall voltage is then independent of the mobility of the charge carriers in the semiconductor material. In order to obtain a Hall signal as large as possible, high-resistance semiconductor material, i.e. a semiconductor material with little doping, is used.

In integrated circuits, Hall generators are therefore always provided in the highest-resistance material occurring in the circuit. This is the case in the collector trays of integrated circuits. In addition, technologies are chosen which yield particularly high-resistance collector trays. For the transistors, particularly high breakthrough voltages are then obtained.

Constant-current operation can generally be accomplished only by an active regulator circuit, where very high independence of the supply voltage and the temperature is obtained.

Under the conditions specified by the operation in practice however, some highly disturbing reservations appear:

1. In many cases, operational readiness with operating voltages down to 4.3 volts must be guaranteed;
2. in practice, temperatures of $-40°$ C. to $+120°$ C. may occur; and
3. in a number of applications, the current drain of the Hall generator plus evaluation electronics is limited to 3 mA.

Under the conditions given, if the Hall generator element is of approximately square shape, the shunt resistance of the Hall generator is two to three kohm. With a temperature coefficient of about $0.8\%/K$ and a maximum temperature of 120°, this value can be expected to double under practical operating conditions.

In order to be able to still operate at the lowest operating voltage to be considered (4.3 volts), only a maximum current of less than 1 mA through the Hall generator is possible. This determines the magnitude of the maximum obtainable signal voltage. In order to be able to still operate at the minimum operating voltage, the control current of the Hall generator can be increased by lowering the Hall generator resistance by increasing the width of the Hall generator element, since the shunt resistance of the Hall generator is inversely proportional to the width of the Hall generator element.

However, only a slight increase of the Hall signal is obtained in this way, because the so-called geometry correction factor of the Hall generator only drops from approximately 0.7 to 0.4 if the length to width ratio is halved. If the control current is doubled, a signal gain of only about 14% is therefore obtained.

It is accordingly an object of the invention to provide a circuit arrangement for enhancing the utilizable Hall-signal of a Hall sensor, which overcomes the hereinbefore-mentioned disadvantages of the heretofore-known devices of this general type, and with which a further increase of the utilizable Hall signal or of the signal gain, can be realized over the above-mentioned measures.

With the foregoing and other objects in view there is provided, in accordance with the invention, a circuit for enhancing the utilizable Hall signal of a Hall sensor, comprising N Hall generators being operated with impressed control current and having Hall signal paths, N voltage to current converters each having an output and each being coupled to the Hall signal path of a different one of said Hall generators, and a common output connected to each of said outputs of said voltage to current converters.

In accordance with another feature of the invention, the voltage to current converters are differential amplifiers having output branches, said output branches carrying signal currents of the same phase being combined.

In accordance a further feature of the invention, the differential amplifiers include transistors having emitters, and including a separate emitter resistor connected to each of the emitters and a separate constant current source connected to each of said resistors.

In accordance with a concomitant feature of the invention, said differential amplifiers include transistors having emitters, and including a separate common emitter resistor being directly coupled to the emitters of each differential amplifier and a separate common constant current source connected to each resistor.

Other features which are considered as characteristic for the invention are set forth in the appended claims.

Although the invention is illustrated and described herein as embodied in circuit arrangement for enhancing the utilizable Hall-signal of a Hall sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing, in which.

Figure 1:
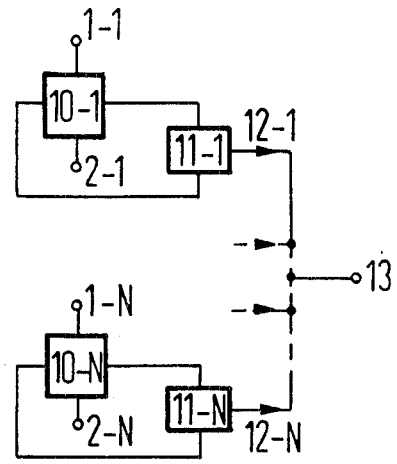
FIG. 1 is a diagrammatic and schematic block circuit diagram of a basic embodiment of a circuit arrangement according to the invention.

Referring now to the figures of the drawing and first, particularly to FIG. 1 thereof, it is seen that N Hall generators 10-1 to 10-N are generally provided in a circuit arrangement according to the invention. A control current is impressed through terminals 1-1, 2-1, ... 1-N, 2-N into each Hall generator. A current transformer 11-1 to 11-N is coupled to the Hall path of each of the Hall generators 10-1 to 10-N. Outputs 12-1 to 12-N of these current transformers 11-1 to 11-N are tied together to form a common output 13. Since the output current of the voltage-to-current converters 11-1 to 11-N are thus added up, an increase of the utilizable output signal of the Hall generators 10-1 to 10-N by a factor N can be provided.

Figure 2:
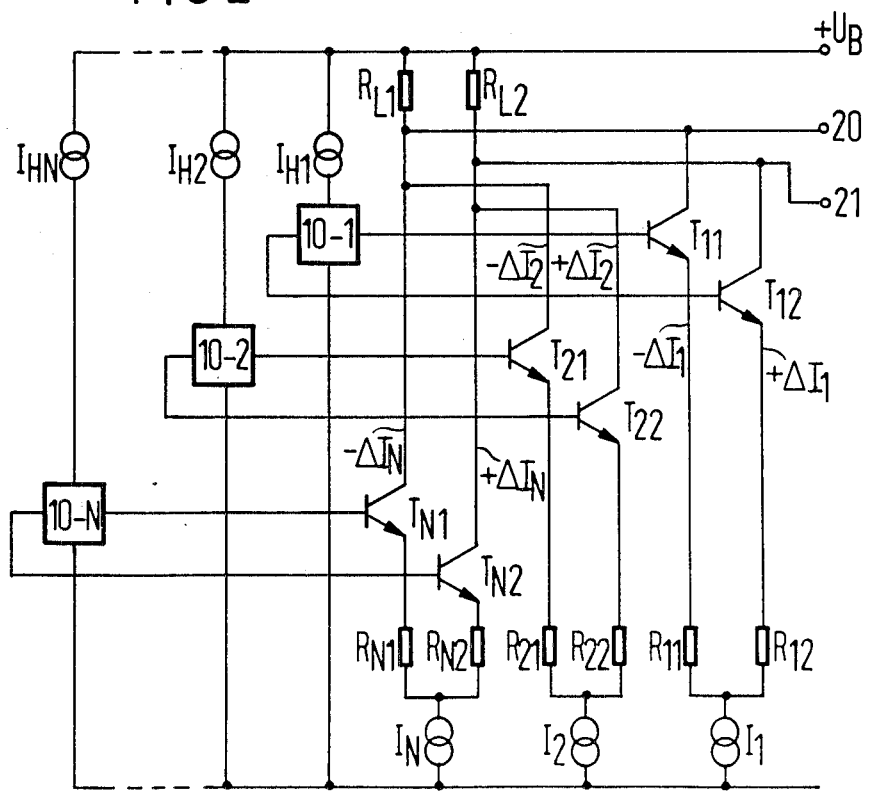
FIG. 2 is a diagrammatic and schematic block circuit diagram of an embodiment of the circuit arrangement according to the invention with differential amplifiers in an evaluator circuit.

According to the embodiment shown in FIG. 2, the voltage-to-current converters of the circuit arrangement according to FIG. 1 are constructed as differential amplifiers, which contain transistors $T_{11}$, $T_{12}$; $T_{21}$, $T_{22}$ to $T_{N1}$, $T_{N2}$. The emitters of the transistors in the differential amplifier are each connected through an emitter resistor $R_{11}$, $R_{12}$; $R_{21}$, $R_{22}$ to $R_{N1}$, $R_{N2}$ to a constant current source $I_1$, $I_2$ to $I_N$. Output branches containing load resistors $R_{L1}$ and $R_{L2}$ which are brought to output terminals 20 and 21 of the circuit arrangement are common to all differential amplifiers. The collectors of the differential amplifier transistors are coupled to the output branches in such a manner that signal currents of respectively equal phase are added up. Thus, the signal currents $-\Delta I_1$, $-\Delta I_2$ to $-\Delta I_N$ of the transistor circuits $T_{11}$, $T_{21}$ to $T_{N1}$ are added up in the output branch of the load resistor $R_{L1}$, while the signal currents $+\Delta I_1$, $+\Delta I_2$, $+\Delta I_N$ of the transistor branches $T_{12}$, $T_{22}$ to $T_{N2}$ are added up in the output branch of the load resistor $R_{L2}$.

Thus, the output signals of the Hall paths of the Hall generators 10-1, 10-2 to 10-N, having a control current impressed therein through constant current sources $I_{H1}$, $I_{H2}$ to $I_{HN}$, are added up because the signal currents $\Delta I$ of the differential amplifiers are always added up in the common load resistors $R_{L1}$ and $R_{L2}$, respectively. For all practical purposes, the collector currents of a transistor are impressed because of the very high output impedance measured at the collector. Because of this, the addition of the collector currents is achieved practically without mutual reaction simply by connecting the corresponding collectors at the load resistors $R_{L1}$ and $R_{L2}$.

Figure 3:
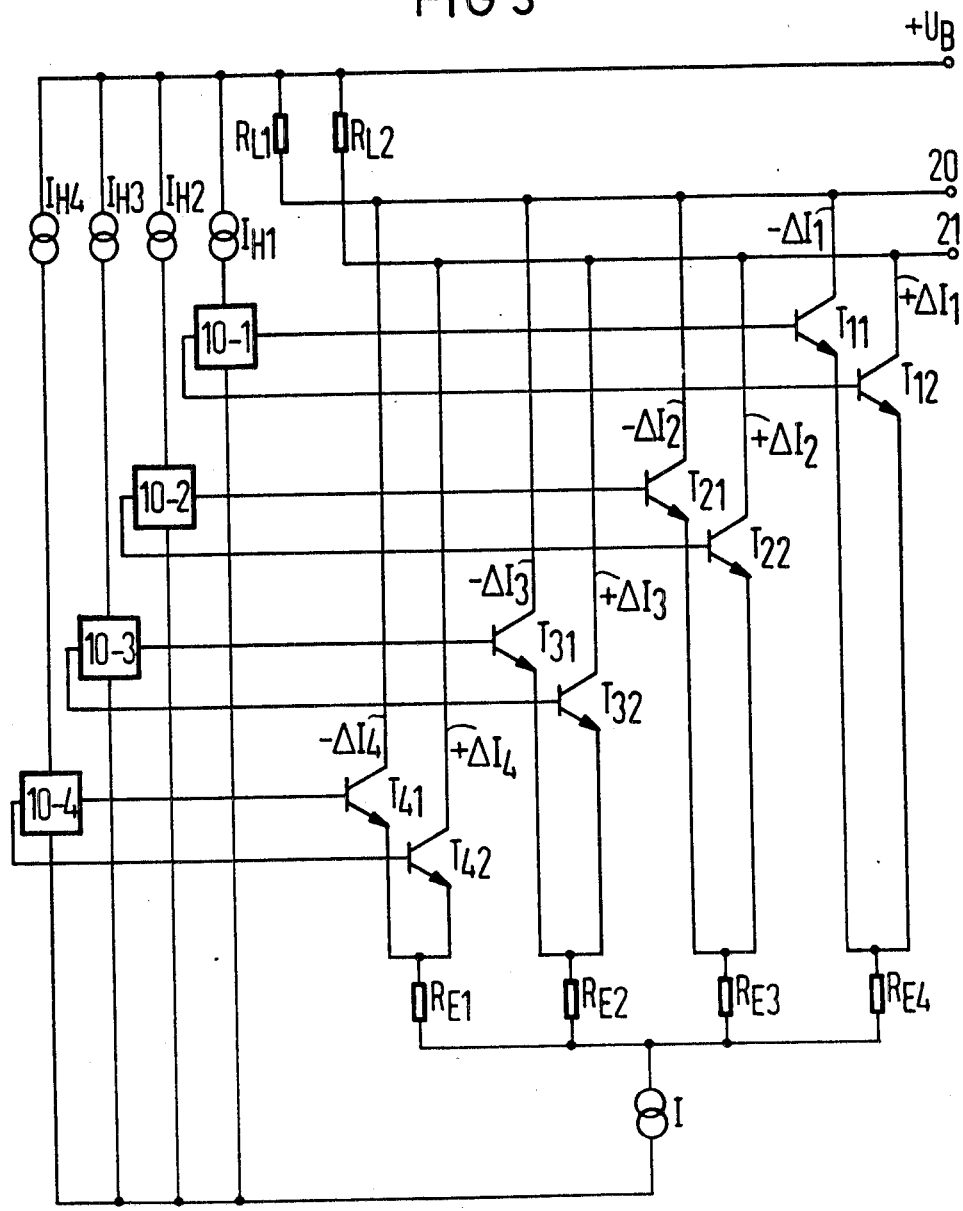
FIG. 3 is a view similar to FIG. 2 of a modified form of a circuit arrangement according to FIG. 2.

In the embodiment of FIG. 3, elements that are identical to those in FIG. 2 are provided with the same reference symbols. According to this circuit, a simplification can be achieved by directly tying the emitters of the differential amplifier transistors together and bringing them through a respective common emitter resistor $R_{E1}$, $R_{E2}$ to $R_{EN}$ to a common, current-impressing constant-current source I.

It is evident from the embodiment examples explained above that, according to the invention, the signal voltages (Hall voltages) of almost an unlimited number of Hall generators can be summed. On one hand, higher evaluation signals are obtained which also allow the analysis of weaker signals, wherein only their mean squared value is obtained by the addition of several statistically scattered errors or zero components.

There are claimed:

1. Circuit for enhancing the utilizable Hall signal of a Hall sensor, comprising N Hall generators being operated with impressed constant control current and having Hall signal paths, N respective voltage to current converters each having an output and each being coupled to the respective Hall signal path of a different one of said Hall generators, and a common output connected to each of said outputs of said respective voltage to current converters.

2. Circuit according to claim 1, wherein said voltage to current converters are differential amplifiers having output branches, said output branches carrying signal currents of the same phase being combined.

3. Circuit according to claim 2, wherein said differential amplifiers include transistors having emitters, collectors and bases, and said Hall signal paths each have two electrodes, and including a separate emitter resistor connected to each of the emitters, separate constant current sources each being connected to all of said emitter resistors connected to a respective one of said differential amplifiers, and separate common load resistors each being connected to the collectors of a respective one of said transistors of each differential amplifier, each base of each differential amplifier being connected to a respective electrode of said Hall signal path of a respective one of said Hall generators.

4. Circuit according to claim 2, wherein said differential amplifiers include transistors having emitters, collectors and bases, and said Hall signal paths each have two electrodes, and including a separate common emitter resistor being directly coupled to the emitters of each differential amplifier, a separate common constant current source connected to each common emitter resistor, and separate common load resistors each being connected to the collectors of a respective one of said transistors of each differential amplifier, each base of each differential amplifier being connected to a respective electrode of said Hall signal path of a respective one of said Hall generators.

* * * * *